(12) United States Patent
Bartenstein et al.

(10) Patent No.: US 8,397,113 B2
(45) Date of Patent: Mar. 12, 2013

(54) METHOD AND SYSTEM FOR IDENTIFYING POWER DEFECTS USING TEST PATTERN SWITCHING ACTIVITY

(75) Inventors: Thomas W. Bartenstein, Owego, NY (US); Patrick Wayne Gallagher, Apalachin, NY (US)

(73) Assignee: Cadence Design Systems, Inc., San Jose, CA (US)

( * ) Notice: Subject to any disclaimer, the term of this patent is extended or adjusted under 35 U.S.C. 154(b) by 337 days.

(21) Appl. No.: 12/903,044

(22) Filed: Oct. 12, 2010

(65) Prior Publication Data

US 2012/0089879 A1 Apr. 12, 2012

(51) Int. Cl.
*G01R 13/28* (2006.01)
*G06F 11/00* (2006.01)

(52) U.S. Cl. ........................................ 714/738; 702/118
(58) Field of Classification Search .................. 714/738; 702/118

See application file for complete search history.

(56) References Cited

U.S. PATENT DOCUMENTS 7,693,676 B1 * 4/2010 Keller et al. .................. 702/118

OTHER PUBLICATIONS

Ravi et al., Methodology for low power test pattern generation using activity threshold control logic, Jun. 2007, IEEE Spectrum, pp. 526529.*

* cited by examiner

*Primary Examiner* — Sam Rizk
(74) *Attorney, Agent, or Firm* — Dickstein Shapiro LLP

(57) ABSTRACT

A method and system for identifying power defects using test pattern switching activity is disclosed. In one embodiment, a plurality of test patterns is applied to a circuit under test, and failure test patterns are identified from the plurality of test patterns by comparing the test result with the predicted test result. A switching activity count is obtained for each of the plurality of test patterns. Based on the switching activity count, ranks for each of the plurality of test patterns are provided. A correlation analysis is performed between the failure test patterns and the ranks of the switching activities. When there is a high correlation between the failure test pattern and the ranks of the switching activities, it is determined that the circuit likely contains a power defect. A power defect analysis is performed under the presence of the high correlation.

11 Claims, 2 Drawing Sheets

METHOD AND SYSTEM FOR IDENTIFYING POWER DEFECTS USING TEST PATTERN SWITCHING ACTIVITY

FIELD

The field of the invention relates generally to hardware and software verification of logic circuits and more particularly relates to a method and system for identifying power defects using test pattern switching activity.

BACKGROUND

Manufactured semiconductor chips may have defects. Test inputs from a tester generated by an automatic test pattern generator (ATPG) are applied to an integrated circuit to identify faulty circuit behaviors caused by a defect from a correct circuit behavior in the integrated circuit under test (CUT). Power defects in the power circuit of the integrated circuit may have an effect of draining excessive power than normally required in a functional mode of the circuit. When such power defects exist, traditional diagnostic techniques are ineffective in isolating them and may lead to misleading conclusions. Therefore, when testing an integrated circuit, it is necessary to distinguish and correctly identify power defects from typical defects that are represented by stuck-at or transition faults.

Power defects are often identified by reapplying a verification test to the circuit under test (CUT) at different voltage settings. If the test passes at a high voltage, but fails at a low voltage, it is probable that the circuit design has a power defect. If this power defect is suspected to be related to a power drainage issue that exhibits different results depending on the applied voltage, power drainage from the CUT is monitored in a specialized power defect test and compared to the expected amount of power drainage to conclude whether or not the CUT satisfies the design criteria.

Testing each circuit with varying voltages for identifying power defects is impractical in a high volume manufacturing environment. Measuring power drainage during a power defect test often requires a more expensive and sophisticated measurement device on the tester. Furthermore, specific design knowledge about allowable power consumption and/or critical power issues is required to correctly identify the presence of power defects and resolve power design issues for real-life applications.

Benefits and solutions in a volume manufacturing environment for chip testing are provided where manufacturing yields are essential. Miscompare data is captured and stored for a power defect analysis. Instead of testing each chip for power measurement, the failure data is used to identify power defects, thus the time for power design testing is significantly reduced. As an added benefit, a sophisticated measurement device for power design testing can be eliminated for cost saving.

SUMMARY

A method and system for identifying power defects using test pattern switching activity is disclosed. In one embodiment, a plurality of test patterns is applied to a circuit under test, and failure test patterns are identified from the plurality of test patterns by comparing the test result with the predicted test result. A switching activity count is obtained for each of the plurality of test patterns. Based on the switching activity count, ranks for each of the plurality of test patterns are provided. A correlation analysis is performed between the failure test patterns and the ranks of the switching activities. When there is a high correlation between the failure test pattern and the ranks of the switching activities, it is determined that the circuit likely contains a power defect. A power defect analysis is performed under the presence of the high correlation.

When a power defect is identified, a power analysis tool 213 is used to identify potential power hot spots that can be used to isolate a potential power defect for a physical failure analysis (PFA) process. The PFA process examines the defective circuit using a scanning electron microscope and/or other sophisticated diagnostic tools to identify the root cause of the defect. Once the root cause has been identified, it is possible to modify either the circuit design itself, or the manufacturing processes used to create the circuit to prevent similar defects from occurring, and to improve the yield of the circuit.

The above and other preferred features described herein, including various novel details of implementation and combination of elements, will now be more particularly described with reference to the accompanying drawings and pointed out in the claims. It will be understood that the particular methods and circuits are shown by way of illustration only and not as limitations of the claims. As will be understood by those skilled in the art, the principles and features of the teachings herein may be employed in various and numerous embodiments without departing from the scope of the claims.

BRIEF DESCRIPTION OF THE DRAWINGS

The accompanying drawings, which are included as part of the present specification, illustrate the presently preferred embodiment of the present invention and together with the general description given above and the detailed description of the preferred embodiment given below serve to explain and teach the principles of the present invention.

Figure 1:
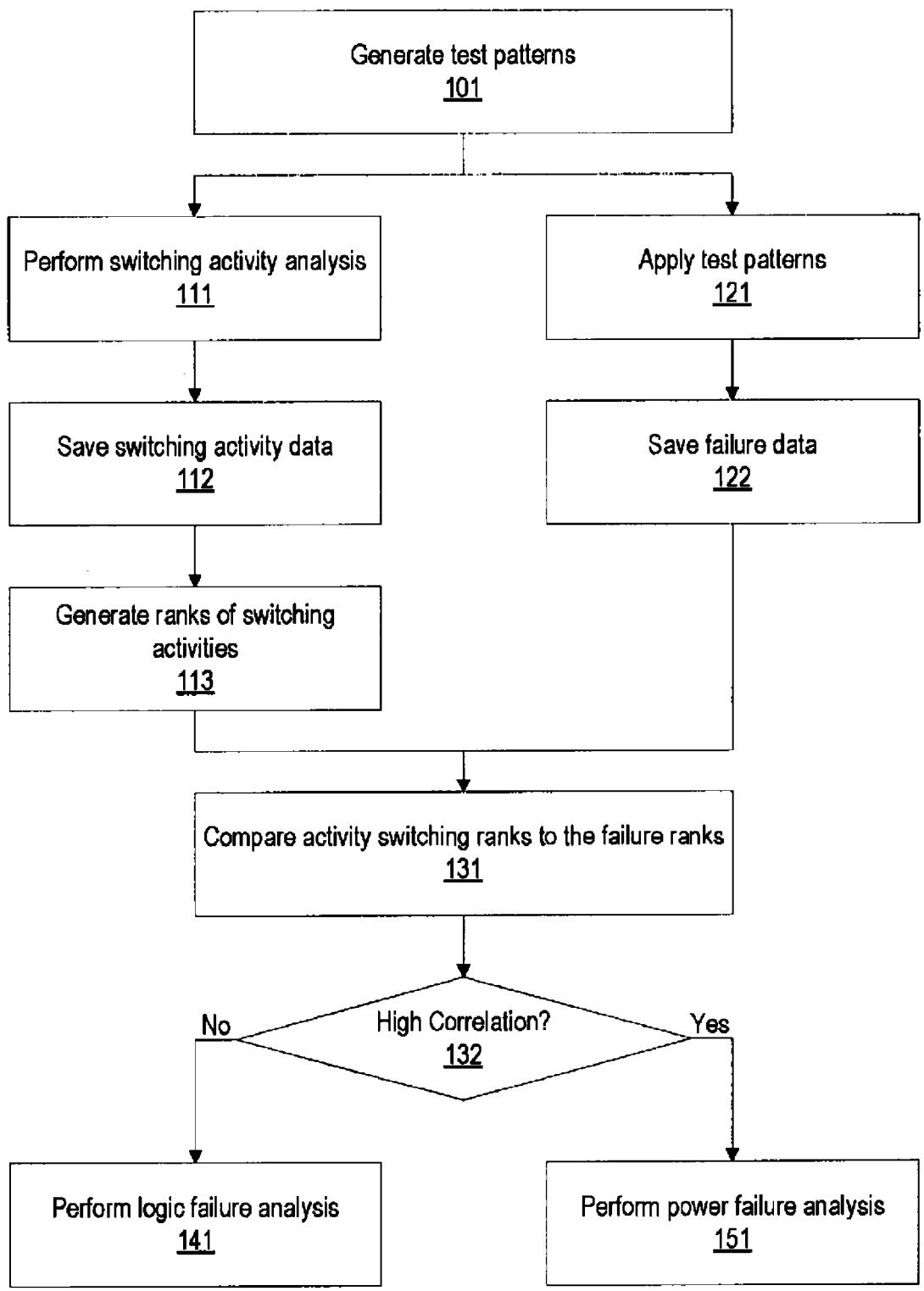
FIG. 1 illustrates a diagram for an exemplary power defect diagnostic analysis, according to one embodiment.

It should be noted that the figures are not necessarily drawn to scale and that elements of similar structures or functions are generally represented by like reference numerals for illustrative purposes throughout the figures. It also should be noted that the figures are only intended to facilitate the description of the various embodiments described herein. The figures do not describe every aspect of the teachings disclosed herein and do not limit the scope of the claims.

DETAILED DESCRIPTION

A method and system for identifying power defects using test pattern switching activity is disclosed. In one embodiment, a plurality of test patterns is applied to a circuit under test, and failure test patterns are identified from the plurality of test patterns by comparing the test result with the predicted test result. A switching activity count is obtained for each of the plurality of test patterns. Based on the switching activity count, ranks for each of the plurality of test patterns are provided. A correlation analysis is performed between the failure test patterns and the ranks of the switching activities. When there is a high correlation between the failure test pattern and the ranks of the switching activities, it is determined that the circuit likely contains a power defect. A power defect analysis is performed under the presence of the high correlation.

Each of the features and teachings disclosed herein can be utilized separately or in conjunction with other features and teachings to provide a method for reducing the order of system models exploiting sparsity. Representative examples utilizing many of these additional features and teachings, both separately and in combination, are described in further detail with reference to the attached drawings. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings.

In the following description, for purposes of explanation only, specific nomenclature is set forth to provide a thorough understanding of the present invention. However, it will be apparent to one skilled in the art that these specific details are not required to practice the present invention.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk, including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms presented herein are not inherently related to any particular computer or other apparatus. Various general purpose systems, design verification systems such as a hardware emulator, simulator, and hardware-accelerated simulator systems, or testers providing scan inputs to such design verification systems may be used with programs in accordance with the teachings herein, or it may prove convenient to construct a more specialized apparatus to perform the required method steps. The required structure for a variety of these systems will appear from the description below. It will be appreciated that a variety of programming languages may be used to implement the teachings of the invention as described herein.

Moreover, the various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

Existing techniques for identifying power defects monitor and record switching activities of a circuit design during a fault simulation when test patterns are applied. In accordance with the present subject matter, the recorded switching activities are post-processed and analyzed by a diagnostic analysis after or sometime during the testing on the circuit design. During the diagnostic analysis, each set of the test patterns that are applied during the test is assigned with a rank based on the number of switching activities. The diagnostic analysis may be performed on a statistically significant subset of test patterns of a higher rank for saving test times. When test patterns fail the test, the failure data is generated to indicate not only the pin within the design where the failure was measured, but also the offset within the test pattern. The failure test may be performed on a circuit design prior to packaging, or for all manufactured die or a percentage sample of the manufactured die.

FIG. 1 illustrates a diagram for an exemplary power defect diagnostic analysis, according to one embodiment. Automated Test Pattern Generator (ATPG) generates test patterns (101). The tester applies these test patterns to a circuit under test CUT (121) and saves failure data (122). At the tester, some test patterns pass, and other test patterns fail. The test patterns that fail the test are saved as failure data. Separately, using the generated test patterns, the tester performs a switching activity analysis to determine the count of switching activity per each test pattern (111). The switching activity data for the test patterns is saved (112) and ranks are assigned to each test pattern (113). Using the saved failure data and ranks of switching activities, a correlation analysis is performed (131).

A high correlation between the failure patterns and the switching activity is considered that there is a high probability that the circuit contains one or more power defects. For example, if test patterns 3, 7, and 9 have the highest switching activity, and test patterns 1, 2, 4, 5, 6, and 8 pass, but test patterns 3, 7, and 9 fail at the tester, it is determined that there is a high correlation between switching activity and failure patterns. This indicates that the cause of the failures is closely correlated to a power defect. Once a power defect is suspected with high confidence based on the level of correlation, a power analysis tool 213 is used to analyze power consumption in each transistor in the presence of specific test patterns to identify the "hot spots"—areas of the circuit that contain transistors that consume the highest amount of power in the presence of the failed test patterns. Due to the high level of correlation between switching activity and power consumption, a power defect is likely to exist in one of these hot spots on the circuit.

If a power defect is suspected based on a high correlation, the CUT is diagnosed with a specialized power failure analysis (151) to confirm that the failures are caused by power defects. If there is not a high correlation between switching activity and failures, the defects are determined not to be power-related, and a traditional logic failure analysis is performed (141) to determine the root cause of the failure without performing a power failure analysis.

According to one embodiment, failure analysis (logic verification test) is performed prior to generating ranks of switching activities. A subset of test patterns that failed during the verification test is selected to generate ranks for switching activities such that the time for correlation analysis is saved while not too much sacrificing the accuracy of the correlation analysis.

The switching activity analysis tool 212 analyzes the switching activity data obtained from a test using a plurality of test patterns. A ranking score per each test pattern is obtained to identify most active test patterns. The ranking is kept in a pattern activity rank file.

The failure analysis tool 211 reads failure data of the failing die, and saves the result in a database. According to one embodiment, dies whose failures occurred in the highest activity patterns are identified, and these failing die are segregated to prevent their inclusion in the defect isolation and yield management studies.

The test patterns that failed for a specific failing die is compared against the switching activity ranking. If the test patterns that failed were closely correlated with the test patterns with high ranks, then the test patterns with the highest activity level were the test patterns that failed on the specific die. The correlation analysis may be performed only on ranks from 1 to N. The lowest rank N may be predetermined based on the type of tests, dies, and/or the number of samples used in the analysis.

Switching activities in a circuit, i.e., the number of signal switches from one state to another, for example for a digital circuit, signal switches from 0 to 1 or vice versa, are proportional to the power required for that circuit. Since more switching activities require more power for transitioning the state of the switching circuitry, there is a high probability that the failures that are closely correlated with high activity patterns may be caused by a power defect.

In one embodiment, the number of switching activity is used for the threshold. For example, the test patterns that exhibited more than 10,000 switching are selected. Alternatively, the switching activity rank may be used for the threshold. For example, the test patterns in the top 10 ranks are selected for the correlation analysis.

In one embodiment, the set of failing patterns are compared to the ranks of switching activity for the test patterns. If a high percentage of the failing patterns are also the highest switching patterns, there is a high probability that a power defect is present. For example, test patterns 1, 2, ... 100 are applied. After analyzing the switching activity for these test patterns, it is shown that test pattern 83 has the highest switching activity, followed by test patterns 21, 45, 62, 71, and 18, in the switching activity order. If the set of failing test patterns includes test patterns 18, 21, 40, 62, 71, and 83, five of the six test patterns that have the highest switching activity are failing patterns, indicating the CUT is likely to contain a power defect with high confidence. If the set of failing test patterns is 12, 31, 42, 55, and 71, then only one (71) of the failing test patterns is among the test patterns with the highest switching activity, it is determined that there is not a high correlation between switching activity and failing patterns, and it is determined that the CUT is unlikely to have a power defect. It is noted that this example for determining the level of correlation (i.e., five out of six for high correlation, one out of six for low correlation) serves illustration purposes and is not meant to be construed as a limitation of the present subject matter.

In one embodiment, the combination of switching ranking and the application of a threshold without ranking may be applied to determine test patterns that are suspected to have power defects. For example, both the first top ten ranked test patterns and the test patterns that switched over 10,000 times are suspected to be related to a power failure and are tested in the power defect test for confirmation of such a power failure. These threshold values (top ten or 10,000 times) may be adaptively updated in the next test to enhance the accuracy of the power defect correlation analysis.

A correlation analysis performed to determine the level of correlation between the selected test patterns and test failures. If all or most of the selected test patterns of high switching activities have failed the test, and all or most of the unselected test patterns of low switching activities have not failed the test, there is a close correlation between the switching activities and a power defect. If the circuit contains a mixture of power defects and logic defects, the correlation analysis may not yield an accurate result. The logic defects caused by shorts, opens of defective transistors may be separately identified by a design verification or physical test on the failed chips, and the test patterns failed by logic defects may be eliminated in the correlation analysis.

In one embodiment, the test patterns may be reapplied to the design for operation at a different voltage to confirm the power failure. Other power failure patterns may be monitored during the retest to confirm a specific mode of power failure.

A particular functional operation of the circuit draws higher power than a normal operation. Thus, the test pattern applied to the circuit in these functional modes of operation may not fully represent the nominal power required for that circuit. Statistically low counts of switching activities may not represent useful relationship between the switching activities and power consumption. In other cases, a certain part of the circuit under test may be operating at a higher voltage, which would draw higher power. Therefore, in order to more accurately predict power failures, switching activities may be combined with additional data such as operating voltage, average power consumption, etc.

The inaccuracy in power modeling may lead to incorrect conclusions if the estimate or assumption is inadequate. If more accurate power estimate is required, especially during the design period, a more complete power analysis of a specific test pattern can be performed using commercially available power analysis tools to obtain a more accurate estimate of the expected power consumption.

A logic defect may also cause increased power consumption. In this case, traditional diagnostic techniques may be better at identifying the root cause of the logic defect than power diagnostic techniques. When a defect combines both logic and power defects, a more sophisticated diagnostic techniques may be employed to isolate power defects from logic defects. The isolated power defects may be further diagnosed to identify the root cause of the problem. If the isolation is not compromised, the test patterns may be reapplied with a different fault model and/or with varying voltages.

According to one embodiment, a power defect causes power failures to occur in test patterns with a low switching activity. In this case, the switching activity ranks may be given a less weight when correlated to the failure data. Alternatively, the test patterns with a higher switching activity count are further analyzed to conclude that they are not closely related to power defects. Those high switching test patterns are excluded from power defect analysis.

The circuit tester providing the test patterns reports switching activity per test pattern as well as the failure data including miscompares. For example, the top 100 test patterns are identified based on the ranks of switching activity. This rank is stored in a pattern activity rank file. The circuit tester reads the failure data from the test of a specific failing die, and stores the results in a database. The circuit tester identifies the die(s) whose failures occurred in the highest activity patterns. Such failing dies are prevented from inclusion in power defect isolation and yield management studies.

The present correlation technique efficiently identifies power defects present in a device in accordance with the above-described procedures. A statistical analysis may be employed in addition to the correlation analysis to increase the chance of accurate identification of power defects. The present technique therefore provides statistically significant improvements over existing techniques.

Figure 2:
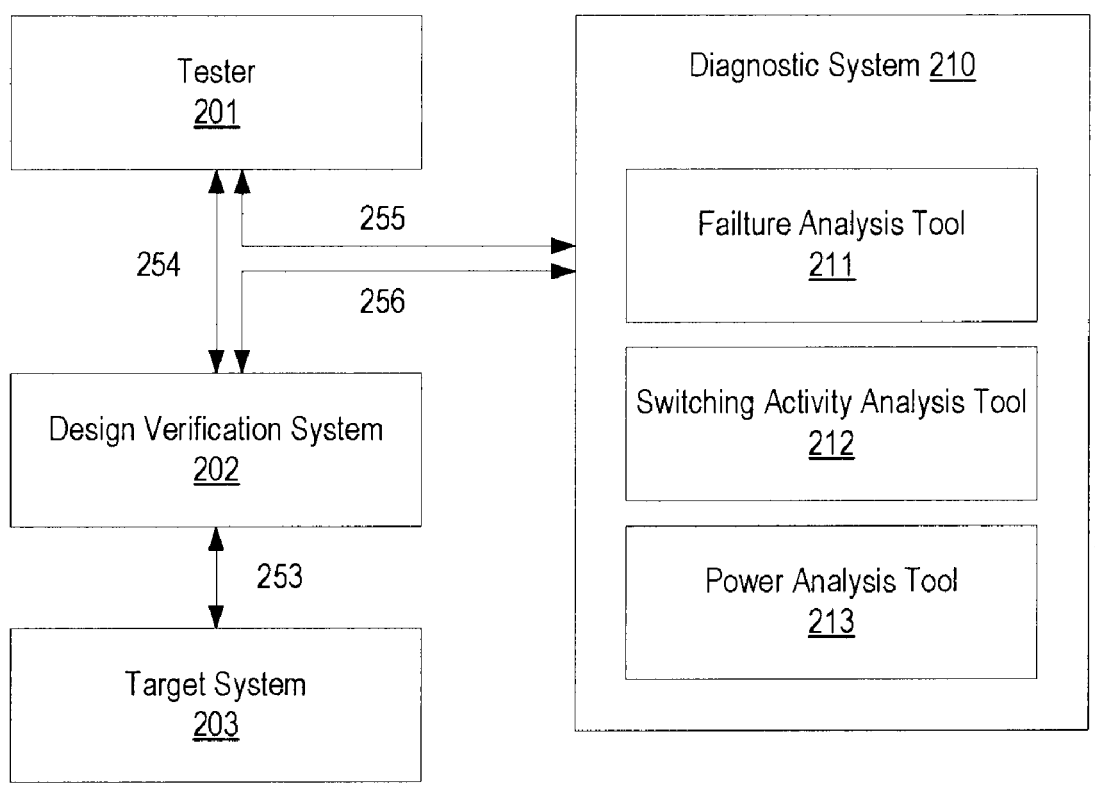
FIG. 2 illustrates an exemplary power analysis system for identifying power defects using test pattern switching activity, according to one embodiment.

FIG. 2 illustrates an exemplary power analysis system for identifying power defects using test pattern switching activity, according to one embodiment. The above-described algorithms for identifying power defects using test pattern switching activity can be implemented in a diagnostic system 210. For example, the diagnostic system 210 includes failure analysis tool 211, switching activity analysis tool 212, and power analysis tool 213. In one embodiment, failure analysis tool 211, switching activity analysis tool 212, and/or power analysis tool 213 may be implemented in a separate analysis tool and provide analysis results to the diagnostic system 210.

Although the diagnostic system 210 shown in FIG. 2 is implemented in a separate system that is coupled to the tester 201 and/or the design verification system 202, it may be incorporated, wholly or partially, in a tester 201 or in a design verification system 202 such as a hardware emulator, simulator, and hardware-accelerated simulator systems. The diagnostic system 210 includes an interface having an input and an output. The interface applies a plurality of test patterns received at the input from the tester 201 and receives a test result from the circuit. Each of the plurality of test patterns generates a predicted test result when no defect is included in the circuit.

The design verification system 202 may be connected to a target system 203. The target system 203 typically includes multiple devices such as memory, microprocessors, application specific integrated circuits (ASIC), field programmable gate arrays (FPGAs), etc. The target system 203 may also include inputs, outputs corresponding to the inputs and outputs of the integrated circuit being emulated and are in electrical communication with communication link 253.

The processor of the diagnostic system performs switching activity analysis, failure analysis, and correlation analysis. The switching analysis generates a switching activity count and provides ranks for each of the plurality of test patterns. The failure analysis identifies failure test patterns that have the test result mismatching with the predicted test result. The correlation analysis correlates these failure test patterns with the ranks of the switching activity count obtained from the switching analysis and determines likelihood of a power defect in the circuit based on a high correlation between the failure test patterns and the ranks of the switching activity count.

A method and system for identifying power defects using test pattern switching activity is disclosed. Although various embodiments have been described with respect to specific examples and subsystems, it will be apparent to those of ordinary skill in the art that the concepts disclosed herein are not limited to these specific examples or subsystems but extends to other embodiments as well. Included within the scope of these concepts are all of these other embodiments as specified in the claims that follow.

We claim:

1. A computer-implemented method, comprising:
applying a plurality of test patterns to a circuit under test, the circuit under test having at least one input where the plurality of test patterns are applied and at least one output where a test result is measured, and each of the plurality of test patterns yielding a predicted test result at the output when no defect is included in the circuit;
identifying failure test patterns from the plurality of test patterns by comparing the test result with the predicted test result, the test result of the failure test patterns mismatching the predicted test result;
obtaining a switching activity count for each of the plurality of test patterns;
providing ranks for each of the plurality of test patterns wherein the ranks are based on the switching activity count;
performing a correlation analysis between the failure test patterns and the ranks of the switching activity count;
determining likelihood of a power defect in the circuit based on a high correlation between the failure test patterns and the ranks of the switching activity count; and
performing a power defect test on the failure test patterns under the presence of the high correlation.

2. The computer-implemented method of claim 1, wherein the switching activity count is stored in a pattern activity rank file.

3. The computer-implemented method of claim 1 further comprising:
reapplying the plurality of test patterns at a different operating voltage to the circuit under test.

4. The computer-implemented method of claim 1, wherein the plurality of test patterns are eliminated in a fault analysis.

5. The computer-implemented method of claim 4, wherein the plurality of test patterns eliminated in the fault analysis contains at least a predetermined number of switching activity count.

6. A computer-readable medium having stored thereon a plurality of instructions, said plurality of instructions when executed by a computer, cause said computer to perform:
applying a plurality of test patterns to a circuit under test, the circuit under test having at least one input where the plurality of test patterns are applied and at least one output where a test result is measured, and each of the plurality of test patterns generating a predicted test result at the output when no defect is included in the circuit;
identifying failure test patterns from the plurality of test patterns by comparing the test result with the predicted test result, the test result of the failure test patterns mismatching the predicted test result;
obtaining a switching activity count for each of the plurality of test patterns;
providing ranks for each of the plurality of test patterns wherein the ranks are based on the switching activity count;
performing a correlation analysis between the failure test patterns and the ranks of the switching activity count;
determining likelihood of a power defect in the circuit based on a high correlation between the failure test patterns and the ranks of the switching activity count; and performing a power defect test on the failure test patterns under the presence of the high correlation.

7. The computer-readable medium of claim 6, wherein the switching activity count is stored in a pattern activity rank file.

8. The computer-readable medium of claim 6 having stored thereon a plurality of instructions, said plurality of instructions when executed by a computer, cause said computer to further perform:

reapplying the plurality of test patterns at a different operating voltage to the circuit under test.

9. The computer-readable medium of claim 8, wherein the plurality of test patterns are eliminated in a fault analysis.

10. The computer-readable medium of claim 9, wherein the plurality of test patterns eliminated in the fault analysis contains at least a predetermined number of switching activity count.

11. A diagnostic system for identifying power failure of a circuit, comprising:

an interface having an input and an output, the interface applying a plurality of test patterns received at the input from a tester and receiving a test result from the circuit, each of the plurality of test patterns generating a predicted test result when no defect is included in the circuit;

means for switching activity analysis generating a switching activity count and providing ranks for each of the plurality of test patterns;

means for failure analysis identifying failure test patterns having the test result mismatching with the predicted test result; and means for correlation analysis between the failure test patterns and the ranks of the switching activity count, wherein the means for correlation analysis determines likelihood of a power defect in the circuit based on a high correlation between the failure test patterns and the ranks of the switching activity count.

* * * * *